(12) United States Patent
Yeh et al.

(10) Patent No.: US 11,199,864 B1
(45) Date of Patent: Dec. 14, 2021

(54) VOLTAGE CONTROL CIRCUIT REDUCING SIGNAL INTERFERENCE

(71) Applicant: RichWave Technology Corp., Taipei (TW)

(72) Inventors: Chia-Jung Yeh, Taipei (TW); Tien-Yun Peng, Taipei (TW); Chih-Sheng Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 17/138,855

(22) Filed: Dec. 30, 2020

(30) Foreign Application Priority Data

Sep. 7, 2020 (TW) .................................. 109130572

(51) Int. Cl.
*G05F 1/575* (2006.01)
*H03F 3/45* (2006.01)

(52) U.S. Cl.
CPC ......... *G05F 1/575* (2013.01); *H03F 3/45475* (2013.01); *H03F 2200/451* (2013.01)

(58) Field of Classification Search
CPC ... G05F 1/575; G05F 1/46; G05F 1/56; G05F 1/565; H03F 3/45475; H03F 2200/451; G11C 27/026; G11C 27/02
See application file for complete search history.

(56) References Cited

U.S. PATENT DOCUMENTS

| | | | |
|---|---|---|---|
| 6,822,511 B1 | 11/2004 | Doherty | |
| 7,502,719 B2 | 3/2009 | Moraveji | |
| 10,001,796 B2 | 6/2018 | Liu | |
| 10,192,630 B1 * | 1/2019 | Hoskins | ............... G11C 27/026 |
| 2011/0273235 A1 | 11/2011 | Chen | |

FOREIGN PATENT DOCUMENTS

WO 2017/100308 A1 6/2017

* cited by examiner

*Primary Examiner* — Jung Kim
(74) *Attorney, Agent, or Firm* — Winston Hsu

(57) ABSTRACT

A voltage controlled circuit includes a tracking circuit, an operational amplifier, a transistor, a feedback circuit and a sample and hold circuit. The tracking circuit generates an updated enabling voltage according to an enabling voltage, a sample enabling voltage and a sample reference voltage. The operational amplifier includes a first input terminal used to receive an input voltage, a second input terminal used to receive a feedback voltage, and an output terminal used to output a control voltage. The transistor includes a control terminal used to receive the control voltage, a first terminal used to receive a reference voltage, and a second terminal used to output a regulated voltage. The feedback circuit generates the feedback voltage according to the regulated voltage. The sample and hold circuit is used to sample the input voltage to generate the sample enabling voltage, and sample the feedback voltage to generate the sample reference voltage.

20 Claims, 4 Drawing Sheets

VOLTAGE CONTROL CIRCUIT REDUCING SIGNAL INTERFERENCE

CROSS REFERENCE TO RELATED APPLICATION

This non-provisional application claims priority of Taiwan patent application No. 109130572, filed on 7th Sep., 2020, included herein by reference in its entirety.

TECHNICAL FIELD

The invention relates to electronic circuits, and in particular, to a voltage control circuit of a power amplifier.

BACKGROUND

In communication devices, power amplifiers are used to amplify signals for transmission of radio frequency signals. The power of the radio frequency signals is required to comply with the communication specification in order to provide sufficient transmission coverage while reducing signal interference between communication devices. Since the power supply of a communication device is typically provided by a battery, the power supply will gradually reduce with time. When the voltage of the battery is too low, the power supplied to the power amplifier will be too low, and the radio frequency signals can no longer meet the requirements of the communication specification, increasing the signal interference between communication devices and degrading the performance of the communication device.

SUMMARY

According to one embodiment of the invention, a voltage control circuit includes a tracking circuit, an operational amplifier, a first reference terminal, a first transistor, a feedback circuit and a sample and hold circuit. The tracking circuit is used to generate an updated enabling voltage according to an enabling voltage, a sample enabling voltage and a sample reference voltage. The updated enabling voltage is updated according to the enabling voltage. The operational amplifier comprises a first input terminal coupled to the tracking circuit and used to receive a first input voltage, a second input terminal used to receive a feedback voltage, and an output terminal used to output a control voltage. The first reference terminal is used to provide a reference voltage. The first transistor includes a control terminal coupled to the output terminal of the operational amplifier and used to receive the control voltage, a first terminal used to receive the reference voltage, and a second terminal used to output a regulated voltage. The feedback circuit is coupled to the second terminal of the first transistor and the second input terminal of the operational amplifier, and is used to generate the feedback voltage according to the regulated voltage. The sample and hold circuit is coupled to the tracking circuit, the operational amplifier and the feedback circuit, and is used to sample the first input voltage to generate the sample enabling voltage, and sample the feedback voltage to generate the sample reference voltage.

DETAILED DESCRIPTION

Figure 1:
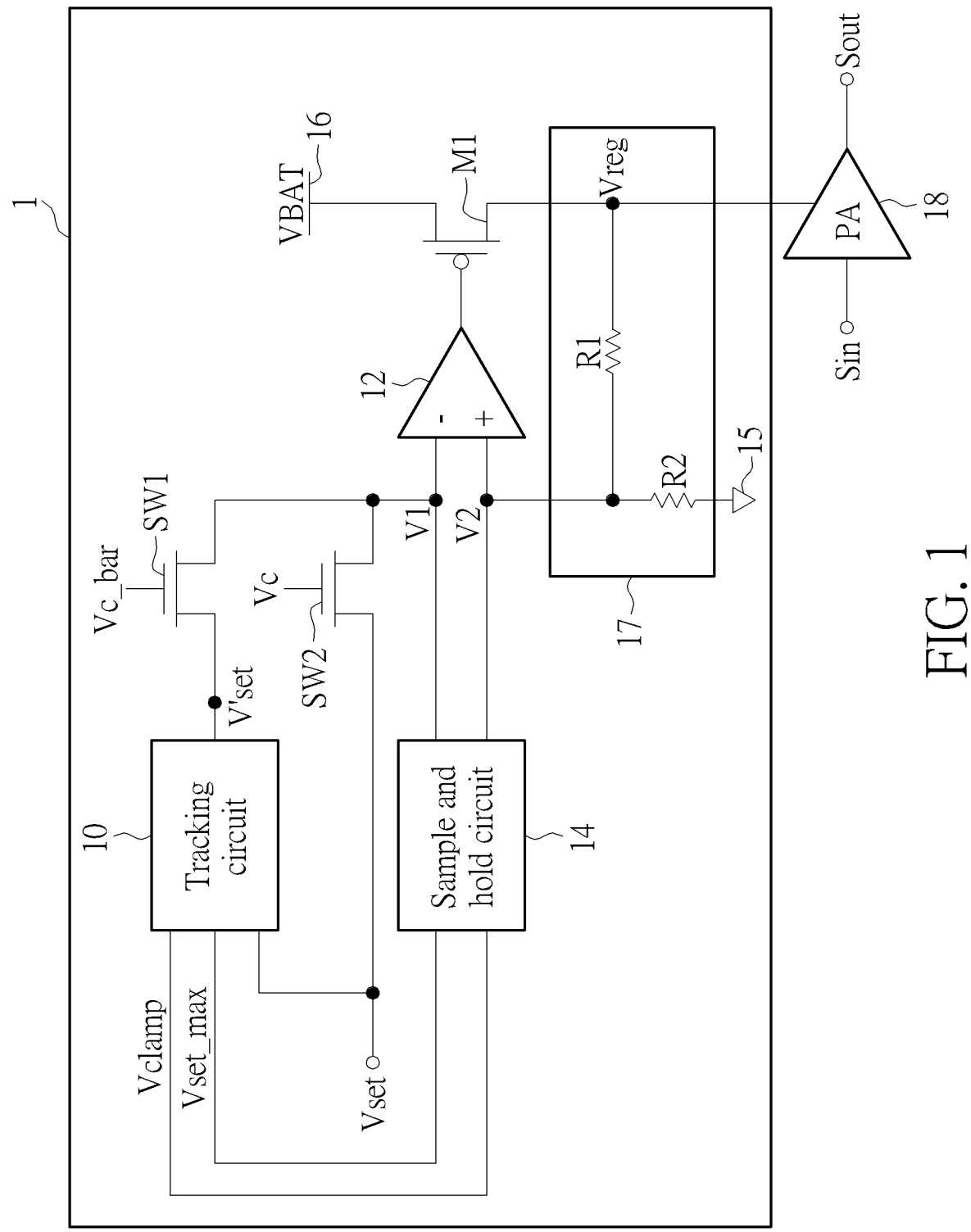
FIG. 1 is a circuit schematic of a voltage control circuit according to an embodiment of the invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 is a circuit schematic of a voltage control circuit 1 according to an embodiment of the invention. The voltage control circuit 1 may be used as a low dropout (LDO) regulator, and may be powered by a reference voltage VBAT to generate a regulated voltage Vreg and supply the regulated voltage Vreg as a power supply to a power amplifier (PA) 18. The voltage control circuit 1 may adjust the regulated voltage Vreg so that when the reference voltage VBAT is greater than or close to the regulated voltage Vreg, the regulated voltage Vreg may be maintained at a substantially stable predetermined level. The reference voltage VBAT is a variable voltage generated by a battery or a battery pack, and may be gradually reduced over time. When the reference voltage VBAT drops to an excessively low level, the voltage control circuit 1 can no longer maintain the regulated voltage Vreg at the predetermined level and will decrease with the reference voltage VBAT.

The voltage control circuit 1 may include a tracking circuit 10, an operational amplifier 12, a sample and hold circuit 14, a reference terminal 16, a feedback circuit 17, and a transistor M1. The reference terminal 16 may provide a reference voltage VBAT. The operational amplifier 12 includes a first input terminal coupled to the tracking circuit 10; a second input terminal coupled to the feedback circuit 17; and an output terminal coupled to the transistor M1. The transistor M1 includes a control terminal coupled to the output terminal of the operational amplifier 12; a first terminal coupled to the reference terminal 16; and a second terminal coupled to the power amplifier 18. The feedback circuit 17 is coupled to the second terminal of the transistor M1 and the second input terminal of the operational amplifier 12, and may generate the feedback voltage V2 according to the regulated voltage Vreg. The feedback voltage V2 may be positively correlated to the regulated voltage Vreg. The power amplifier 18 includes a supply terminal configured to receive the regulated voltage Vreg; an input terminal configured to receive an AC (alternating current) signal Sin; and an output terminal configured to output an amplified AC signal Sout. The AC signal Sin and the amplified AC signal Sout may be radio frequency signals.

The first input terminal of the operational amplifier 12 may be an inverting input terminal, and the second input terminal of the operational amplifier 12 may be a non-inverting input terminal. The first input terminal of the operational amplifier 12 may receive the input voltage V1, the second input terminal of the operational amplifier 12 may receive the feedback voltage V2, and the output terminal of the operational amplifier 12 may generate a control voltage according to a difference between the feedback voltage V2 and the input voltage V1. The control terminal of the transistor M1 may receive the control voltage, and the second terminal of the transistor M1 may output the regulating voltage Vreg according to the control voltage. The transistor M1 may be a field-effect transistor (FET), e.g., an P-type metal-oxide-semiconductor field-effect transistor (MOSFET), and may be configured into a common source amplification stage. When the feedback voltage V2 is substantially equal to the input voltage V1, the control voltage is substantially equal to 0V, and the transistor M1 is turned on to generate the regulating voltage Vreg; when the feedback voltage V2 is less than the input voltage V1, the control voltage is less than 0V, the conduction level of the transistor M1 increases, thereby increasing the regulated voltage Vreg. When the reference voltage VBAT is less than the predetermined level of the regulated voltage Vreg, the regulated voltage Vreg output by the second terminal of the transistor M1 will be less than the predetermined level. When the power amplifier 18 is turned off, the input voltage V1 must be reduced to a level less than the feedback voltage V2 to reduce the regulated voltage Vreg.

Figure 2:
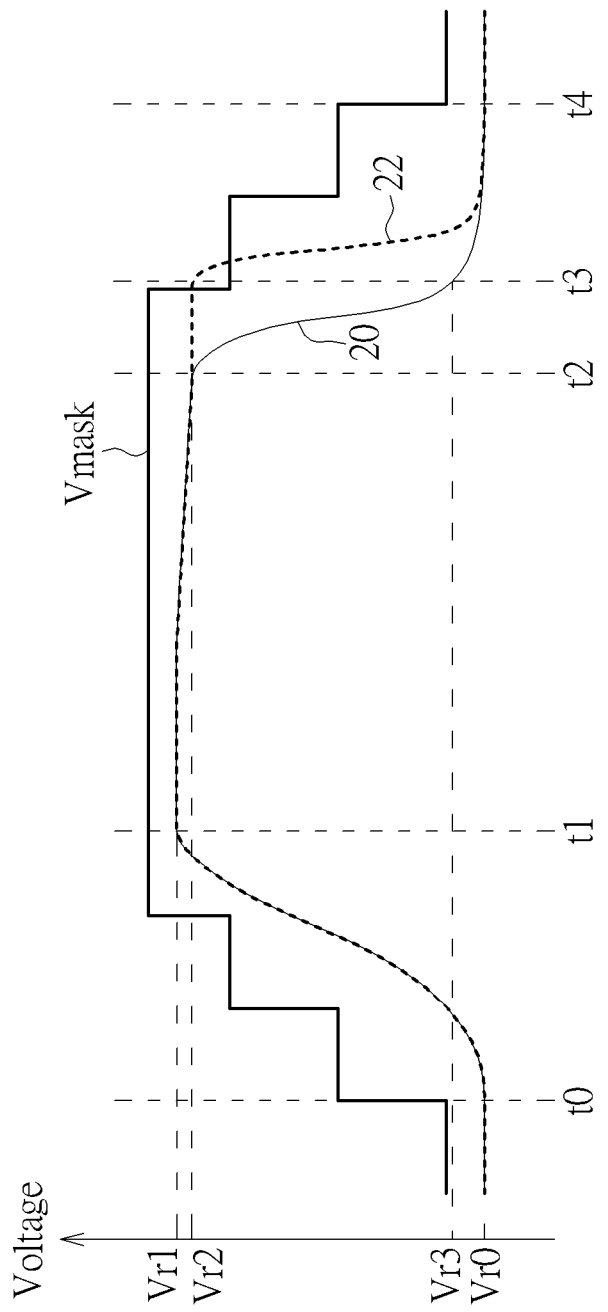
FIG. 2 shows waveforms of the regulated voltage in FIG. 1.

FIG. 2 shows waveforms of the regulated voltage Vreg, the mask Vmask defined in the communication specification, a waveform 20 of a regulated voltage Vreg compliant with the communication specification and a waveform 22 of a regulated voltage Vreg incompliant with the communication specification. The waveform 20 may correspond to a waveform generated by the embodiments of the present invention, and the waveform 22 may correspond to a waveform in the prior art. When the power amplifier 18 is in operation, the regulated voltage Vreg must stay within the mask Vmask in order to comply with the communication specification without adding signal interference to other devices. At Time t0, the power amplifier 18 is to be turned on, and the waveforms 20 and 22 start to rise from a low level Vr0. At Time t1, the waveforms 20 and 22 rise to a predetermined level Vr1. The time interval between Times t0 and t1 may be referred to as a ramp-up period. At Time t2, the power amplifier 18 is to be turned off, the waveform 20 begins to descend from the level Vr2, and the waveform 22 remains at the level Vr2. The level Vr2 may be less than the predetermined level Vr1. The time interval between Times t1 and t2 may be referred to as a PA power-on period, in which the power amplifier 18 may amplify the AC signal Sin. At Time t3, the waveform 20 drops to the level Vr3, and the waveform 22 starts to drop from the level Vr2. At Time t4, the waveforms 20 and 22 decrease to the low level Vr0. The time interval between Times t2 and t4 may be referred to as a ramp-down period. Time t4 to Time t0 may be referred to as a PA power-off period. The power amplifier 18 cannot operate during the PA power-off period, and the power amplifier 18 will be turned on again at Time t0. Since the waveform 22 only starts to drop from the level Vr2 at Time t3, the waveform 22 will exceed the mask Vmask at Time t3, not complying with the communication specifications and causing signal interference to other devices. In addition, a sudden drop of the waveform 22 from the level Vr2 to the low level Vr0 during the time interval between Time t3 and Time t4 will result in a transient noise, causing signal interference to internal circuits. On the contrary, the waveform 20 gradually descends during the ramp-down period without exceeding the mask Vmask, conforming to the communication specification, and causing reduced signal interference to other devices or internal circuits.

After Time t2, the voltage control circuit 1 may modify the input voltage V1 with a feedback voltage V2 by the sample and hold circuit 14 and the tracking circuit 10. For example, immediately after Time t2, the input voltage V1 will be pulled to the feedback voltage V2 to generate the waveform 20 of the regulated voltage Vreg that complies with the communication specification. The sample and hold circuit 14 may be coupled to the tracking circuit 10, the operational amplifier 12 and the feedback circuit 17. During the ramp-down period, the sample and hold circuit 14 may sample and hold the input voltage V1 to generate the sample enabling voltage Vset_max, and sample and hold the feedback voltage V2 to generate the sample reference voltage Vclamp. The tracking circuit 10 may generate an updated enabling voltage V'set according to an enabling voltage Vset, a sample enabling voltage Vset_max and a sample reference voltage Vclamp, the updated enabling voltage V'set being updated according to the enabling voltage Vset. The update enabling voltage V'set may be positively correlated to the sample reference voltage Vclamp, and negatively correlated to the sample enabling voltage Vset_max. Specifically, the tracking circuit 10 may divide the sample reference voltage Vclamp by the sampling enabling voltage Vset_max to generate a ratio (Vclamp/Vset_max), and multiply the ratio (Vclamp/Vset_max) and the enabling voltage Vset to generate the updated enabling voltage V'set, as expressed in Equation 1:

$$V'\text{set} = (V\text{clamp}/V\text{set\_max}) * V\text{set} \qquad \text{Equation 1}$$

If the reference voltage VBAT is less than the predetermined level of the regulated voltage Vreg, the feedback voltage V2 is less than the input voltage V1, and the sample reference voltage Vclamp is less than the sampling enabling voltage Vset_max, the updated enabling voltage V'set may be a scale-down value of the enabling voltage Vset generated according to the ratio (Vclamp/Vset_max). The tracking circuit 10 may be implemented by a multiplier circuit.

In one embodiment, the voltage control circuit 1 may further include switches SW1 and SW2. The switches SW1 and SW2 may be set to switch between the enabling voltage Vset and the update enabling voltage V'set to generate the input voltage V1 according to the update enabling voltage V'set during the ramp-down period, and to generate the input voltage V1 according to the enabling voltage Vset the non-ramp-down period. The non-ramp-down period may be all times outside the ramp-down period, and may include the ramp-up period, the PA power-on period, and the PA power-off period. Since the update enabling voltage V'set may be a scale-down value proportional to the enabling voltage Vset by the ratio (Vclamp/Vset_max), the input voltage V1 in the ramp-down period may be pulled to the feedback voltage V2 and descend from the feedback voltage V2, thereby generating the waveform 20 of the regulated voltage Vreg satisfying the communication specification. The conduction states of the switches SW1 and SW2 may be reversed. In the non-ramp-down period, the first control signal Vc_bar will turn off the first switch SW1, and the second control signal Vc will turn on the second switch SW2. In the ramp-down period, the first control signal Vc_bar will turn on the first switch SW1 for a first predetermined time, and the second control signal Vc will turn off the second switch SW2 for the first predetermined time. The first predetermined period may be less than the ramp-down period. The second control signal Vc and the first control signal Vc_bar may be inverting to each other, and may be set to a logic low level or a logic high level. The second control signal Vc may be an active high signal, and the first control signal Vc_bar may be an active low signal. In the embodiment, the switch SW1 and the switch SW2 may be of the same type of transistors, for example, both are N-type transistors such as NMOS transistors. In other embodiments, the switch SW1 and the switch SW2 may be of different types of transistors, for example, one of them is an N-type transistor and the other one is a P-type transistor, and the second control signal Vc and the first control signal Vc_bar may be signals with the same level. The switch SW1 includes a control terminal configured to receive a first control signal Vc_bar, a first terminal coupled to the tracking circuit 10 and configured to receive the updated enabling voltage V'set, and a second terminal coupled to the first input terminal of the operational amplifier 12 and configured to output the first input voltage V1. The switch SW2 includes a control terminal configured to receive a second control signal Vc; a first terminal configured to receive the enabling voltage Vset; and a second terminal coupled to the first input terminal of the operational amplifier 12 and configured to output the first input voltage V1.

The feedback circuit 17 may include feedback impedances R1 and R2. The feedback resistor R1 includes a first terminal coupled to the second terminal of the transistor M1; and a second terminal coupled to the second input terminal of the operational amplifier 12, and configured to generate the feedback voltage V2. The feedback resistor R2 includes a first terminal coupled to the second terminal of the feedback resistor R1; and a second terminal coupled to a reference terminal 15. The reference terminal 15 may provide a ground voltage, e.g., 0V. The impedance values of the feedback impedances R1 and R2 may be used to adjust the regulated voltage Vreg. When the impedance value of the feedback impedance R1 increases and/or the impedance value of the feedback impedance R2 decreases, the regulated voltage Vreg will increase; when the impedance value of the feedback impedance R1 decreases and/or the impedance value of the feedback impedance R2 increases, the regulated voltage Vreg will decrease. In some embodiments, the impedance values of the feedback impedances R1 and R2 may adjust the regulated voltage Vreg to (8/3)V'set. In other embodiments, the regulated voltage Vreg may be adjusted to other values by changing the impedance values of the feedback impedances R1 and R2.

During the ramp-up period, the enabling voltage Vset may be gradually pulled from the low level to the high level. During the ramp-down period, the enabling voltage Vset may be gradually pulled from the high level to the low level. During the PA power-on period, the enabling voltage Vset may be maintained at the high level. During the PA power-off period, the enabling voltage Vset may be maintained at the low level. The low level may be 0V, and the high level may be different from or equal to the logic high level. The enabling voltage Vset may be generated externally or generated by a voltage generator.

Figure 3:
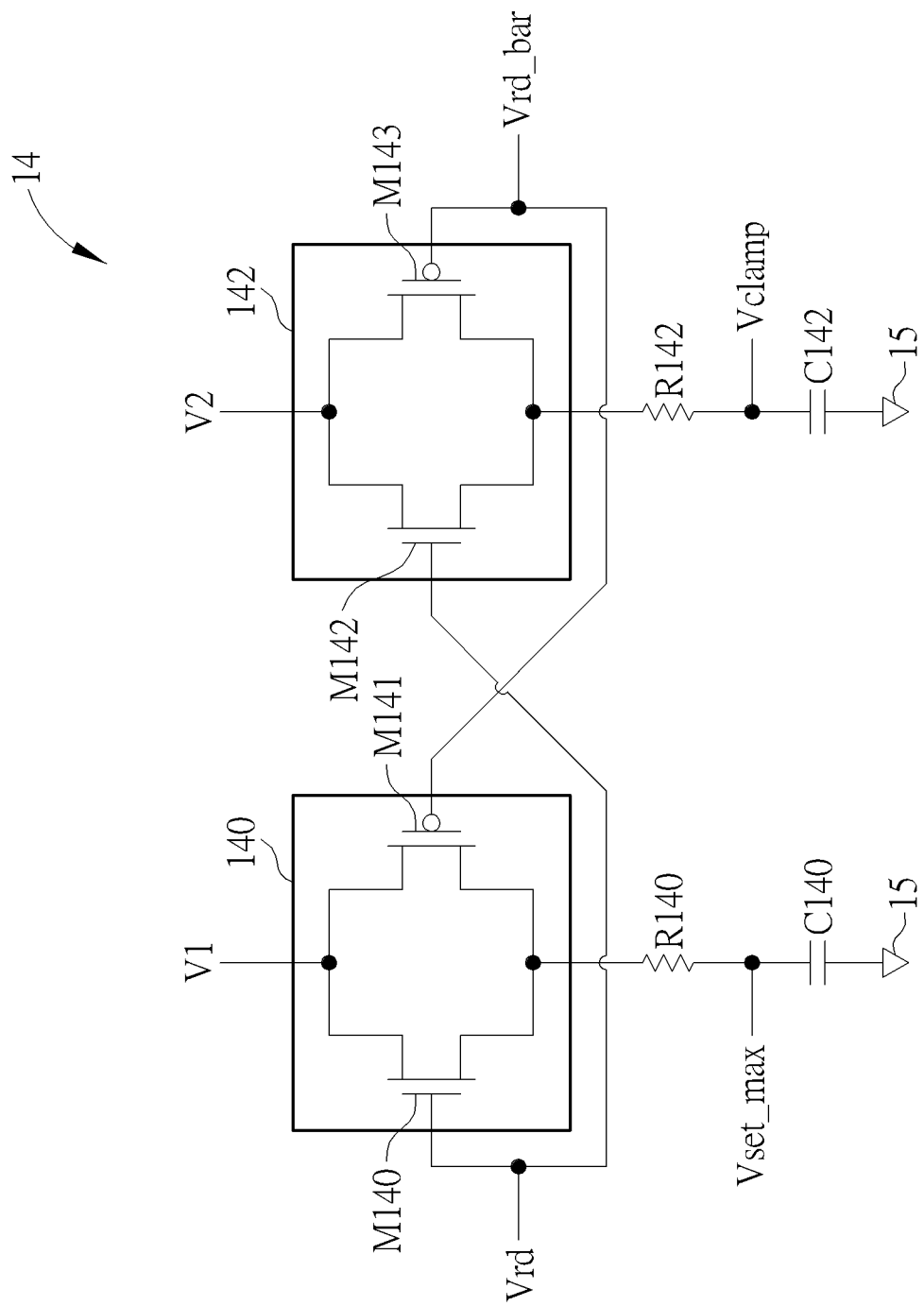
FIG. 3 is a circuit schematic of the sample and hold circuit in FIG. 1.

FIG. 3 is a circuit schematic of the sample and hold circuit 14. The sample and hold circuit 14 includes a transmission gate 140, a resistor R140, a capacitor C140, a transmission gate 142, a resistor R142, and a capacitor C142.

The transmission gate 140 may sample the first input voltage V1 according to a sample control voltage Vrd and an inverted sample control voltage Vrd_bar to generate the sample enabling voltage Vset_max. The resistor R140 includes a first terminal coupled to the transmission gate 140; and a second terminal configured to output the sample enabling voltage Vset_max. The capacitor C140 includes a first terminal coupled to the second terminal of the resistor R140; and a second terminal coupled to the second reference terminal 15. The transmission gate 142 may be configured to sample the feedback voltage V2 according to the sample control voltage Vrd and the inverted sample control voltage Vrd_bar to generate the sample reference voltage Vclamp. The resistor R142 includes a first terminal coupled to the transmission gate 142; and a second terminal configured to output the sample reference voltage Vclamp. The capacitor C142 includes a first terminal coupled to the second terminal of the resistor R142; and a second terminal coupled to the second reference terminal 15.

The transmission gate 140 includes a transistor M140 and a transistor M141. The transistor M140 includes a control terminal configured to receive the sample control voltage Vrd; a first terminal configured to receive the first input voltage V1; and a second terminal coupled to the first terminal of the resistor R140. The transistor M141 includes a control terminal configured to receive the inverted sample control voltage Vrd_bar; a first terminal configured to receive the first input voltage V1; and a second terminal coupled to the first terminal of the resistor R140. The transmission gate 142 includes a transistor M142 and a transistor M143. The transistor M142 includes a control terminal configured to receive the sample control voltage Vrd; a first terminal configured to receive the feedback voltage V2; and a second terminal coupled to the first terminal of the resistor R142. The transistor M143 includes a control terminal configured to receive the inverted sample control voltage Vrd_bar; a first terminal configured to receive the feedback voltage V2; and a second terminal coupled to the first terminal of the resistor R142. The transistor M140 and the transistor M142 may be of a first type of semiconductor, the transistor M141 and the transistor M143 may be of a second type of semiconductor, and the first type of semiconductor and the second type of semiconductor may be different. For example, the transistor M140 and the transistor M142 may be N-type transistors such as NMOS transistors. The transistor M141 and the transistor M143 may be P-type transistors such as PMOS transistors.

The sample control voltage Vrd and the inverted sample control voltage Vrd_bar may be opposite in phase, and may be set to the logic low level or the logic high level. The sample control voltage Vrd may be the active high signal, and the inverted sample control voltage Vrd_bar may be the active low signal. In some embodiments, the sample control voltage Vrd and the second control signal Vc may be opposite in phase, and the sample control voltage Vrd_bar and the first control signal Vc_bar may be opposite in phase. During the ramp-down period, the sample control voltage Vrd may turn on the transmission gate 140 for a first predetermined time to sample the input voltage V1 and generate the sampling enabling voltage Vset_max, and store the sampling enabling voltage Vset_max in the capacitor C140; and the sample control voltage Vrd may turn on the transmission gate 142 for the first predetermined time to sample the feedback voltage V2 and generate the reference voltage Vclamp, and store the reference voltage Vclamp in the capacitor C142. The first predetermined time for the sample control voltage Vrd to turn on the transmission gate 140 may be less than the ramp-down period, and may be substantially equal to the first predetermined time of the first control signal Vc_bar turning on the switch SW1. The sample enabling voltage Vset_max may be the maximum sample value of the input voltage V1 during the first predetermined time, and the sample reference voltage Vclamp may be the maximum sample value of the feedback voltage V2 during the first predetermined time.

Figure 4:
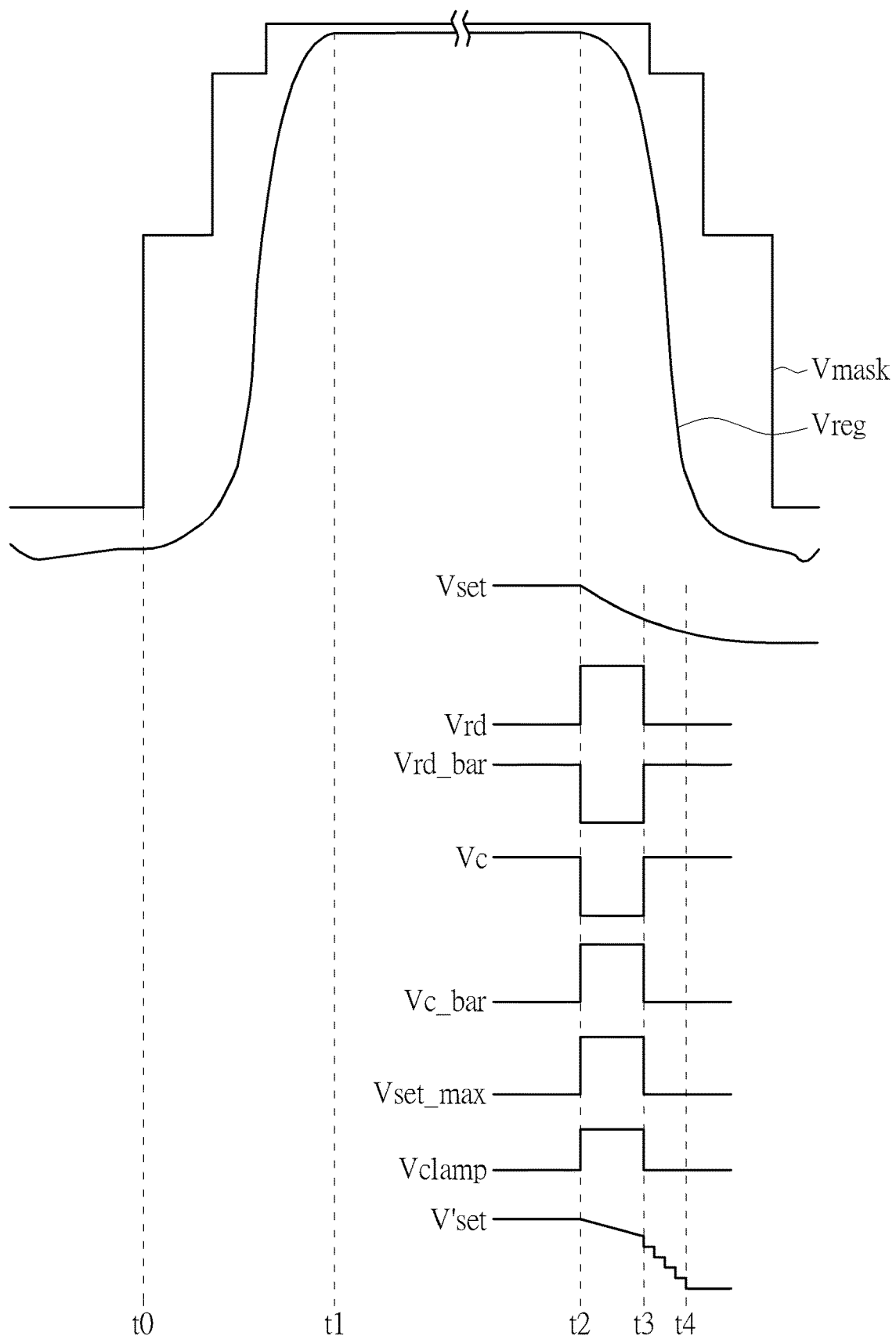
FIG. 4 is a timing diagram of the voltage control circuit in FIG. 1.

FIG. 4 is a timing diagram of the voltage control circuit 1, showing the regulated voltage Vreg, the mask Vmask, the enabling voltage Vset, the sample control voltage Vrd, the inverted sample control voltage Vrd_bar, the second control signal Vc, and the first control signal Vc_bar, the sample enabling voltage Vset_max, the sample reference voltage Vclamp and the updated enabling voltage V'set. At Time t2, the ramp-down period begins, the sample control voltage Vrd is pulled from the logic low level to the logic high level, the inverted sample control voltage Vrd_bar is pulled from the logic high level to the logic low level, the transmission gate 140 in the sampling and holding circuit 14 is enabled to sample the input voltage V1 to generate a sampling enabling voltage Vset_max, and the transmission gate 142 in the sampling and hold circuit 14 is enabled to sample the feedback voltage V2 to generate a sample reference voltage Vclamp; the tracking circuit 10 generates the update enabling voltage V'set according to Equation 1; the second control signal Vc is pulled from the logic high level to the logic low level, and the first control signal Vc_bar is pulled from the logic low level to the logic high level, and the switch SW1 is turned on and switch SW2 is turned off to pull down the input voltage V1 according to the update enabling voltage V'set, and therefore, the regulated voltage Vreg starts to drop. At Time t3, the sample control voltage Vrd is pulled from the logic high level to the logic low level, the inverted sample control voltage Vrd_bar is pulled from the logic low level to the logic high level, and the transmission gates 140 and 142 in the sample and hold circuit 14 are disabled; the second control signal Vc is pulled from the logic low level to the logic high level, the first control signal Vc_bar is pulled from the logic high level to the logic low level, the switch SW1 is turned off and the switch SW2 is turned on to pull down the input voltage V1 according to the enabling voltage Vset. Since the input voltage V1 starts being less than the feedback voltage V2 at this time, the operational amplifier 12 will gradually lower the regulated voltage Vreg according to the input voltage V1, and the feedback voltage V2 will gradually decrease with the regulated voltage Vreg. At Time t4, the ramp-down period ends, the enabling voltage Vset drops to the low level Vr0, and the regulated voltage Vreg also drops to the low level Vr0. The regulated voltage Vreg gradually descends during the ramp-down period without exceeding the mask Vmask, being compliant with the communication specification, and reducing signal interference to other devices or internal circuits.

In the embodiments of the present invention, upon the ramp-down period, the voltage control circuit 1 modifies the input voltage V1 according to the feedback voltage V2 by the sampling and holding circuit 14 and the tracking circuit 10, generating a smoother descending waveform of the regulated voltage Vreg, being compliant with the communication specifications, reducing the transient noise, reducing signal interference to other devices or internal circuits, and enhancing device performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage control circuit comprising:
    a tracking circuit configured to generate an updated enabling voltage according to an enabling voltage, a sample enabling voltage and a sample reference voltage, the updated enabling voltage being updated according to the enabling voltage;
    an operational amplifier, comprising a first input terminal coupled to the tracking circuit and configured to receive a first input voltage, a second input terminal configured to receive a feedback voltage, and an output terminal configured to output a control voltage;
    a first reference terminal configured to provide a reference voltage;
    a first transistor, comprising a control terminal coupled to the output terminal of the operational amplifier and configured to receive the control voltage, a first terminal configured to receive the reference voltage, and a second terminal configured to output a regulated voltage;
    a feedback circuit, coupled between the second terminal of the first transistor and the second input terminal of the operational amplifier, and configured to generate the feedback voltage according to the regulated voltage; and
    a sample and hold circuit, coupled to the tracking circuit, the operational amplifier and the feedback circuit, and configured to sample the first input voltage to generate the sample enabling voltage, and sample the feedback voltage to generate the sample reference voltage.

2. The voltage control circuit of claim 1, wherein the feedback circuit comprises:
    a first feedback resistor, comprising a first terminal coupled to the second terminal of the first transistor, and a second terminal coupled to the second input terminal of the operational amplifier, and configured to generate the feedback voltage; and
    a second feedback resistor, comprising a first terminal coupled to the second terminal of the first feedback resistor, and a second terminal coupled to a second reference terminal.

3. The voltage control circuit of claim 1, wherein the reference voltage is variable.

4. The voltage control circuit of claim 3, wherein the reference voltage decreases with time.

5. The voltage control circuit of claim 1, wherein the tracking circuit is configured to generate the updated enabling voltage positively correlated to the sample reference voltage and negatively correlated to the sample enabling voltage.

6. The voltage control circuit of claim 1, wherein the tracking circuit is configured to divide the sample reference voltage by the sample enabling voltage to generate a ratio, and multiply the ratio and the enabling voltage to generate the updated enabling voltage.

7. The voltage control circuit of claim 1, wherein the sample and hold circuit comprises:
    a first transmission gate, configured to sample the first input voltage according to a sample control voltage and an inverted sample control voltage to generate the sample enabling voltage;
    a first resistor, comprising a first terminal coupled to the first transmission gate, and a second terminal configured to output the sample enabling voltage;
    a first capacitor, comprising a first terminal coupled to the second terminal of the first resistor, and a second terminal coupled to the second reference terminal;
    a second transmission gate, configured to sample the feedback voltage according to the sample control voltage and the inverted sample control voltage to generate the sample reference voltage;
    a second resistor, comprising a first terminal coupled to the second transmission gate, and a second terminal configured to output the sample reference voltage; and
    a second capacitor, comprising a first terminal coupled to the second terminal of the second resistor, and a second terminal coupled to the second reference terminal.

8. The voltage control circuit of claim 7, wherein:
the sample control voltage and the inverted sample control voltage are opposite in phase; and
in a ramp-down period, the sample control voltage is configured to turn on the first transmission gate and the second transmission gate for a first predetermined period.

9. The voltage control circuit of claim 8, wherein the first predetermined period is less than the ramp-down period.

10. The voltage control circuit of claim 7, wherein:
the first transmission gate comprises:
 a second transistor, comprising a control terminal configured to receive the sample control voltage, a first terminal configured to receive the first input voltage, and a second terminal coupled to the first terminal of the first resistor; and
 a third transistor, comprising a control terminal configured to receive the inverted sample control voltage, a first terminal configured to receive the first input voltage, and a second terminal coupled to the first terminal of the first resistor; and
the second transmission gate comprises:
 a fourth transistor, comprising a control terminal configured to receive the sample control voltage, a first terminal configured to receive the feedback voltage, and a second terminal coupled to the first terminal of the second resistor; and
 a fifth transistor, comprising a control terminal configured to receive the inverted sample control voltage, a first terminal configured to receive the feedback voltage, and a second terminal coupled to the first terminal of the second resistor.

11. The voltage control circuit of claim 10, wherein the second transistor and the fourth transistor are N-type transistors, and the first transistor, the third transistor and the fifth transistor are P-type transistors.

12. The voltage control circuit of claim 1, further comprises:
a first switch, comprising a control terminal configured to receive a first control signal, a first terminal coupled to the tracking circuit and configured to receive the updated enabling voltage, and a second terminal coupled to the first input terminal of the operational amplifier and configured to output the first input voltage; and
a second switch, comprising a control terminal configured to receive a second control signal, a first terminal configured to receive the enabling voltage, and a second terminal coupled to the first input terminal of the operational amplifier and configured to output the first input voltage.

13. The voltage control circuit of claim 12, wherein a conduction state of the first switch is opposite to a conduction state of the second switch.

14. The voltage control circuit of claim 12, wherein:
in a non-ramp-down period, the first control signal is configured to turn off the first switch, and the second control signal is configured to turn on the second switch; and
in a ramp-down period, the first control signal is configured to turn on the first switch for a first predetermined time, and the second control signal is configured to turn off the second switch for the first predetermined time.

15. The voltage control circuit of claim 14, wherein the first predetermined period is less than the ramp-down period.

16. The voltage control circuit of claim 12, wherein the first switch and the second switch are N-type transistors, and the first transistor is a P-type transistor.

17. The voltage control circuit of claim 1, wherein the first transistor is configured to output the regulated voltage to a power amplifier.

18. The voltage control circuit of claim 17, wherein the power amplifier comprises:
a supply terminal, configured to receive the regulated voltage;
an input terminal, configured to receive an alternating current (AC) signal; and
an output terminal, configured to output an amplified AC signal.

19. The voltage control circuit of claim 1, wherein the first input terminal of the operational amplifier is an inverting input terminal, and the second input terminal of the operational amplifier is a non-inverting input terminal.

20. The voltage control circuit of claim 1, wherein the tracking circuit is a multiplier circuit.

\* \* \* \* \*